US011724340B2

(12) United States Patent
Zhan et al.

(10) Patent No.: US 11,724,340 B2
(45) Date of Patent: Aug. 15, 2023

(54) ADDITIVE MANUFACTURING OF MLD-ENHANCED DRILLING TOOLS

(71) Applicant: Saudi Arabian Oil Company, Dhahran (SA)

(72) Inventors: Guodong Zhan, Dhahran (SA); Timothy E. Moellendick, Dhahran (SA); Bodong Li, Dhahran (SA)

(73) Assignee: Saudi Arabian Oil Company, Dhahran (SA)

(*) Notice: Subject to any disclaimer, the term of this patent is extended or adjusted under 35 U.S.C. 154(b) by 1099 days.

(21) Appl. No.: 16/421,164

(22) Filed: May 23, 2019

(65) Prior Publication Data

US 2020/0368967 A1 Nov. 26, 2020

(51) Int. Cl.
*B33Y 30/00* (2015.01)
*B33Y 10/00* (2015.01)
(Continued)

(52) U.S. Cl.
CPC ............ *B33Y 30/00* (2014.12); *B22F 1/16* (2022.01); *B22F 1/17* (2022.01); *B22F 10/28* (2021.01); *B22F 10/34* (2021.01); *B22F 12/86* (2021.01); *B23K 26/1224* (2015.10); *B23K 26/342* (2015.10); *B28B 1/001* (2013.01);
(Continued)

(58) Field of Classification Search
CPC ..... B29C 64/31; B29C 64/153; B29C 64/268; B33Y 10/00; B33Y 30/00; B33Y 50/02; B33Y 40/00; B33Y 70/00; B23K 26/1224; B23K 26/342; B23K 2101/002; B28B 1/001; B28B 17/0081
See application file for complete search history.

(56) References Cited

U.S. PATENT DOCUMENTS 9,731,471 B2 8/2017 Schaedler et al.
2010/0255198 A1* 10/2010 Cleary ................ C23C 16/4402
427/255.39
(Continued)

FOREIGN PATENT DOCUMENTS

DE 102011008809 7/2012
DE 102011008809 A1 * 7/2012 ............ B22F 1/0011
(Continued)

OTHER PUBLICATIONS

King et al., "Atomic layer deposition of TiO2 films on particles in a fluidized bed reactor," Power Technology, vol. 183, Issue 3, Apr. 2008, 8 pages.
(Continued)

*Primary Examiner* — Yung-Sheng M Tsui
(74) *Attorney, Agent, or Firm* — Fish & Richardson P.C.

(57) ABSTRACT

Methods, systems, and apparatus for carrying out rapid on-site optical chemical analysis in oil feeds are described. In one aspect, a system for manufacture of a tool includes a deposition reactor configured for molecular layer deposition or atomic layer deposition of metal powder to manufacture coated particles, a fabrication unit configured for 3D printing of the tool, and a controller that controls the deposition reactor and the fabrication unit, wherein the fabrication unit and the deposition reactor are integrated for automated fabrication of the tool using the coated particles from the deposition reactor as building material for the 3D printing.

16 Claims, 6 Drawing Sheets

(51) Int. Cl.
  *B33Y 40/00* (2020.01)
  *B33Y 50/02* (2015.01)
  *B23K 26/12* (2014.01)
  *B23K 26/342* (2014.01)
  *B29C 64/314* (2017.01)
  *B29C 64/153* (2017.01)
  *B29C 64/268* (2017.01)
  *B28B 1/00* (2006.01)
  *B28B 17/00* (2006.01)
  *B22F 10/28* (2021.01)
  *B22F 12/86* (2021.01)
  *B22F 10/34* (2021.01)
  *B22F 1/16* (2022.01)
  *B22F 1/17* (2022.01)
  *B33Y 70/00* (2020.01)
  *B23K 101/00* (2006.01)
  *B22F 12/17* (2021.01)
  *B22F 12/47* (2021.01)
  *B22F 10/32* (2021.01)

(52) U.S. Cl.
  CPC ........ *B28B 17/0081* (2013.01); *B29C 64/153* (2017.08); *B29C 64/268* (2017.08); *B29C 64/314* (2017.08); *B33Y 10/00* (2014.12); *B33Y 40/00* (2014.12); *B33Y 50/02* (2014.12); *B22F 10/32* (2021.01); *B22F 12/17* (2021.01); *B22F 12/47* (2021.01); *B23K 2101/002* (2018.08); *B33Y 70/00* (2014.12)

(56) References Cited

U.S. PATENT DOCUMENTS

| | | | |
|---|---|---|---|
| 2011/0236575 A1 | 9/2011 | King et al. | |
| 2015/0290878 A1 | 10/2015 | Houben et al. | |
| 2016/0339517 A1 | 11/2016 | Joshi et al. | |
| 2017/0072636 A1* | 3/2017 | Ng | B05C 19/04 |
| 2017/0182558 A1* | 6/2017 | Shimizu | B33Y 30/00 |
| 2017/0211331 A1 | 7/2017 | Vempati et al. | |
| 2017/0314335 A1 | 11/2017 | Kosonde et al. | |
| 2017/0342557 A1* | 11/2017 | Baum | C23C 16/4483 |
| 2017/0368603 A1* | 12/2017 | Beals | B33Y 10/00 |
| 2018/0056435 A1* | 3/2018 | Ladani | H01L 23/373 |
| 2018/0133804 A1* | 5/2018 | van Hassel | B22F 10/66 |
| 2018/0161874 A1* | 6/2018 | Nuechterlein | C22C 32/0047 |
| 2019/0054686 A1* | 2/2019 | Herzog | B29C 64/20 |
| 2019/0091769 A1* | 3/2019 | Karuppoor | B33Y 40/20 |
| 2020/0171752 A1* | 6/2020 | Rogren | B29C 64/336 |
| 2020/0276638 A1* | 9/2020 | King | B22F 1/054 |
| 2021/0026332 A1* | 1/2021 | Inoue | B22F 10/60 |
| 2021/0387259 A1* | 12/2021 | Barnes | B22F 12/41 |

FOREIGN PATENT DOCUMENTS

| | | |
|---|---|---|
| EP | 1923475 | 5/2008 |
| EP | 3260223 | 12/2017 |
| FR | 3051699 | 12/2017 |
| WO | WO 2018/046361 | 3/2018 |

OTHER PUBLICATIONS

Zhan et al. "Effect of β-to-α Phase Transformation on the Microstructural Development and Mechanical Properties of Fine-Grained Silicon Carbide Ceramics." Journal of the American Ceramic Society 84.5, May 2001, 6 pages.

Zhan et al. "Single-wall carbon nanotubes as attractive toughening agents in alumina-based nanocomposites." Nature Materials 2.1, Jan. 2003, 6 pages.

Zhan et al., "Atomic Layer Deposition on Bulk Quantities of Surfactant Modified Single-Walled Carbon Nanotubes," Journal of American Ceramic Society, vol. 91, Issue 3, Mar. 2008, 5 pages.

GCC Examination Report in Gulf Cooperation Council Appln. No. GC 2020-39793, dated Jul. 31, 2021, 3 pages.

PCT International Search Report and Written Opinion in International Appln. No. PCT/US2020/034208, dated Oct. 5, 2020, 13 pages.

EPO Communication Pursuant to Article 94(3) in European Appln No. 20732380.9, dated Mar. 16, 2023, 7 pages.

* cited by examiner

ADDITIVE MANUFACTURING OF MLD-ENHANCED DRILLING TOOLS

TECHNICAL FIELD

This disclosure relates to manufacturing of drilling tools.

BACKGROUND

Three-dimensional (3D) printing or additive manufacturing (AM) is a process of making three dimensional solid objects from a digital file. Unlike most conventional manufacturing techniques, additive manufacturing forms objects by building matter up, rather than removing it. In the additive process of 3D printing, an object is created by laying down successive layers of material, with up to micrometer accuracy, until the object is created. Paired with computer-aided design (CAD) software, 3D printing enables production of complex functional shapes using less material than does traditional manufacturing methods.

A nanocoating is the sealing or coating of a material at the atomic level through methods such as molecular layer deposition (MLD) or atomic layer deposition (ALD). MLD or ALD can provide a simple method of placing conformal, pinhole-free, chemically-bonded, and nanoscale-thickness films on individual primary fine particle surfaces or objective surfaces. Particle MLD is a technology that has the potential to replace many applications involving chemical vapor deposition or sol-gel based particle coating processes.

SUMMARY

This disclosure describes 3D printing or additive manufacturing automation systems and methods enhanced by particle MLD or ALD nanocoatings that functionalize 3D printing feedstock particles (or powders) to produce cost-effective and high performance drilling tools or equipment or devices with multifunctional properties for oil and gasoline drilling and completions. This disclosure describes combining 3D powder printing technology with MLD particle nanocoating technology and additive manufacturing automation to make multifunctional tools for application in hydrocarbon recovery or for in-situ tool repair.

There are many applications in oil and gas drilling for tools manufactured with MLD coated particles. The surface chemical properties of downhole tools made with particles modified by MLD can be taken advantage of while retaining the bulk properties of the original particles. MLD can deposit protective and insulating coatings on particles or component surfaces to prevent particle oxidation, corrosion, or electrical conduction. MLD coatings on particles can also modify the optical or mechanical properties of the particles. Various composite core/shell structures can be fabricated using MLD on particles that may have a designed chemical reactivity.

One aspect of the matter described in this specification includes a system for manufacture of a drilling tool that includes a deposition reactor configured for molecular layer deposition or atomic layer deposition of metal powder to manufacture coated particles, a fabrication unit configured for 3D printing of the drilling tool, and a controller that controls the deposition reactor and the fabrication unit, where the fabrication unit and the deposition reactor are integrated for automated fabrication of the drilling tool using the coated particles from the deposition reactor as building material for the 3D printing.

The system can optionally include one or more of the following features. The deposition reactor can include a reaction tray for collecting the coated particles. The reaction tray can have pores and be made of metal. The pores can permit the passage of gas but not of solid particles. The reaction tray can be movable to transfer the coated particles out of the deposition reactor. The deposition reactor can have a first access configured as an inlet for substrate particles, and a second and third accesses configured as inlets for precursor gases. The system can have a tunnel that joins the deposition reactor and the fabrication unit. The transport tunnel can have a conveyor belt configured to transport the coated particles from the deposition reactor to the fabrication unit. The fabrication unit can have a printing platform, a printing platform lift, and a 3D printing head. The 3D printing head can be a laser head. The system can have a vacuum system configured to control gases within the system. The system can have at least one additional deposition reactor attached to the fabrication unit.

Another aspect of this specification includes a method of manufacturing a drilling tool, including providing at least one deposition reactor configured for molecular layer deposition or atomic layer deposition of metal powder to create coated particles, providing a fabrication unit configured for 3D printing of the drilling tool, the fabrication unit attached to the deposition reactor, and providing a controller comprising instructions for controlling the fabrication unit and the deposition reactor for automated fabrication of the drilling tool using the coated particles from the deposition reactor as building material for the 3D printing.

The method can optionally include one or more of the following features. The instructions can include directing substrate particles to enter the deposition reactor via first access and directing precursor gases to enter the deposition reactor via second and third accesses. The instructions can include actuating a metal reaction tray to cause the coated particles to exit the deposition reactor and enter a tunnel that joins the deposition reactor to the fabrication unit. The instructions include heating an interior of the fabrication unit with a heater. The instructions can include filling an interior of the fabrication unit with an inert gas. The instructions can include directing a 3D printing head to fuse a group of coated particles that are present on a printing platform within the fabrication unit according to a design file to form a cross-sectional bottom layer of the drilling tool. The instructions can include directing a platform lift to lower the platform by a height approximately equal to a thickness of the bottom layer of the drilling tool. The instructions can include causing a new group of coated particles to cover the bottom layer of the drilling tool. The instructions can include directing the 3D printing head to fuse the new group of coated particles overlying the bottom layer according to the design file to form an additional cross-sectional layer of the drilling tool.

MLD and ALD are related processes, and it should be understood that this disclosure relates to use of either or both techniques combined with additive manufacturing.

The details of one or more embodiments of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This disclosure relates to seamless integration of two processes, ALD or MLD and additive manufacturing (or 3D printing). Strength-enhancing material is coated onto nano- or micro-scale particles using ALD or MLD. The coated particles are then used to manufacture tools (for example, drilling tools) used in oil and gas applications. These two processes are seamlessly integrated.

Particular embodiments of the subject matter described in this disclosure can be implemented so as to realize one or more of the following advantages. These advantages include fabrication of drilling tools that possess multifunctional properties in a single unit part. These properties include greater strength, greater toughness, higher chemical (corrosive) resistance, greater thermal stability, or similar properties in comparison to a tool that has not been treated as disclosed in this disclosure. The MLD functionalizing 3D printing additive manufacturing automation can be applied to drilling part/component in-situ repair or control of loss zones or lost circulation, or both. The automation of the MLD functionalizing 3D printing additive manufacturing process leads to reduced fabrication time.

A conventional high wear resistance coating process where a coating material usually having film thicknesses of 100~1000 micrometers can be applied on the outer surface of the manufactured product. In this case, only the surface layer contains the wear resistance property and the wearing process accelerates when the surface layer is removed or partially damaged. By contrast, building materials coated through MLD are in the individual particle phase, which enhances the wear resistance of each of the particles. After the additive manufacturing process, the overall wear resistance of the object will advantageously not be affected by the partial material removal or the damage of the surface. MLD on other polymers can be also useful to functionalize the polymer surface, to create unique inorganic/organic polymer composites, and to deposit gas diffusion barrier on polymers to protect the sensors in harsh downhole environments.

Other advantages include fabrication of completion and different tools that possess multifunctional properties in a single unit part.

FIGS. 1A-D schematically illustrate a manufacturing system 100 and the workflow for carrying out automated and combined 3D printing processes of ALD- or MLD-enhanced multifunctional drilling tools using the manufacturing system 100. The ALD/MLD coating process takes place in the deposition reactor 105 and manufactures the coated particles that are the building material for the fabricated tools. The additive manufacturing (AM) tools are manufactured from the particles generated in the deposition reactor 105 by 3D printing that is carried out by the fabrication unit.

The deposition reactor 105 and fabrication unit 110 are operatively coupled by a transport tunnel 115. To streamline the process, the components of the manufacturing system 100 including the deposition reactor 105, the fabrication unit 110, and the transport tunnel 115 are installed within a vacuum system 120 that allows vacuum to be applied to any and all of the components. This vacuum system 120 not only guarantees the quality of the MLD/ALD coating process but also prevents oxidation of the metallic particles during the 3D metallic printing. Various vacuum valves 122 regulate the vacuum within the interior of the manufacturing system 100 (and are illustrated only schematically in the figures).

Figure 1A:
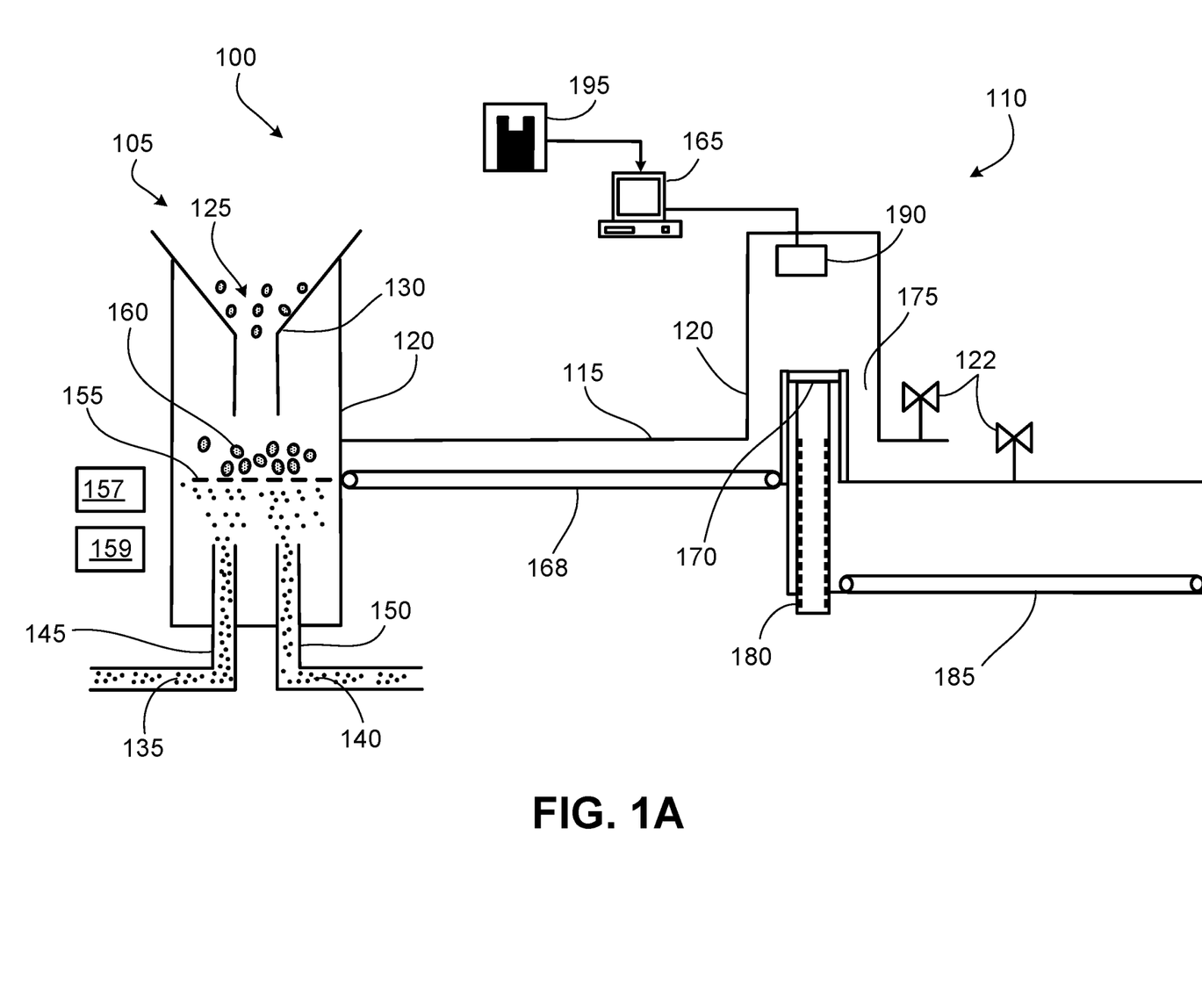
FIGS. 1A-D show schematics of a manufacturing system that combines MLD and 3D printing.

As shown in FIG. 1A, the MLD/ALD coating process takes place within the deposition reactor 105. Substrate particles 125 (or powder) are supplied to the deposition reactor 105 through a first access 130, for example a funnel. The substrate particles 125 are the cores or nuclei of the final building particles that are used by the fabrication unit 110. Examples of materials for the substrate particles are described later. Precursors 135, 140 for the ALD/MLD reaction enter the deposition reactor 105 through second and third accesses 145, 150, one at a time. That is, the first precursor 135 enters the reactor 105 via second access 145, and allowed to fully react with the entire surface of the substrate particles 125. Any excess first precursor 135 will then be purged out, for example, via the second access 145 or from an additional purge aperture. The second precursor 140 is then introduced, for example, through the third access 150. In some examples, the second and third accesses 145, 150 are combined into a single precursor access and the precursors 135, 140 are introduced sequentially through the single precursor access. Examples of materials for the precursors are described later. The first access 130 is shown at the top of the deposition reactor 105 and the second and third accesses 145, 150 and the bottom, but other configurations are possible (the reverse, sides of the deposition reactor 105).

A motorized reaction tray 155 separates the first access 130 from the second and third accesses 145, 150. The reaction tray 155 is a porous metal tray, with pores smaller than the substrate particles 125 but large enough to allow the gas molecules of the precursors 135, 140 to pass through the pores of the reaction tray 155 to coat the substrate particles 125. The reaction tray 155 is made of a metal that does not react with either of the precursors 135, 140, for example, stainless steel. The (result of the chemical reaction of the) gas molecules of the precursors 135, 140 interact with the substrate particles 125, coating them and forming coated particles 160 with the substrate particles 125 at their cores. The coated particles (either in particle form, or solidified) collect on the motorized reaction tray 155 and are transported via a conveyor belt 168 in the transport tunnel 115 to the fabrication unit 110. The reaction tray 155 has a tray sensor 157 and tray motor 159.

The fabrication unit 110 includes a printing platform 170, a powder bed 175, a printing platform lift 180, and a second conveyor belt 185 that holds and conveys the finished pieces out of the vacuum system 120. A controller 165 controls a 3D printing head 190 to carry out the AM in accordance with a design file 195 stored in a memory in the controller 165. For example, the controller 165 can be a computer or processor. In some embodiments, the controller 165 is a stand-alone processor, or it can also control and synchronize the actions of the other components of the manufacturing system 100. The 3D printing head 190 can emit a laser beam, electron beam, or other heat source capable of melting the coated particles 160. This melting forms, for example, glass phases to bond or fuse the coated particles 160 together.

Figure 1B:
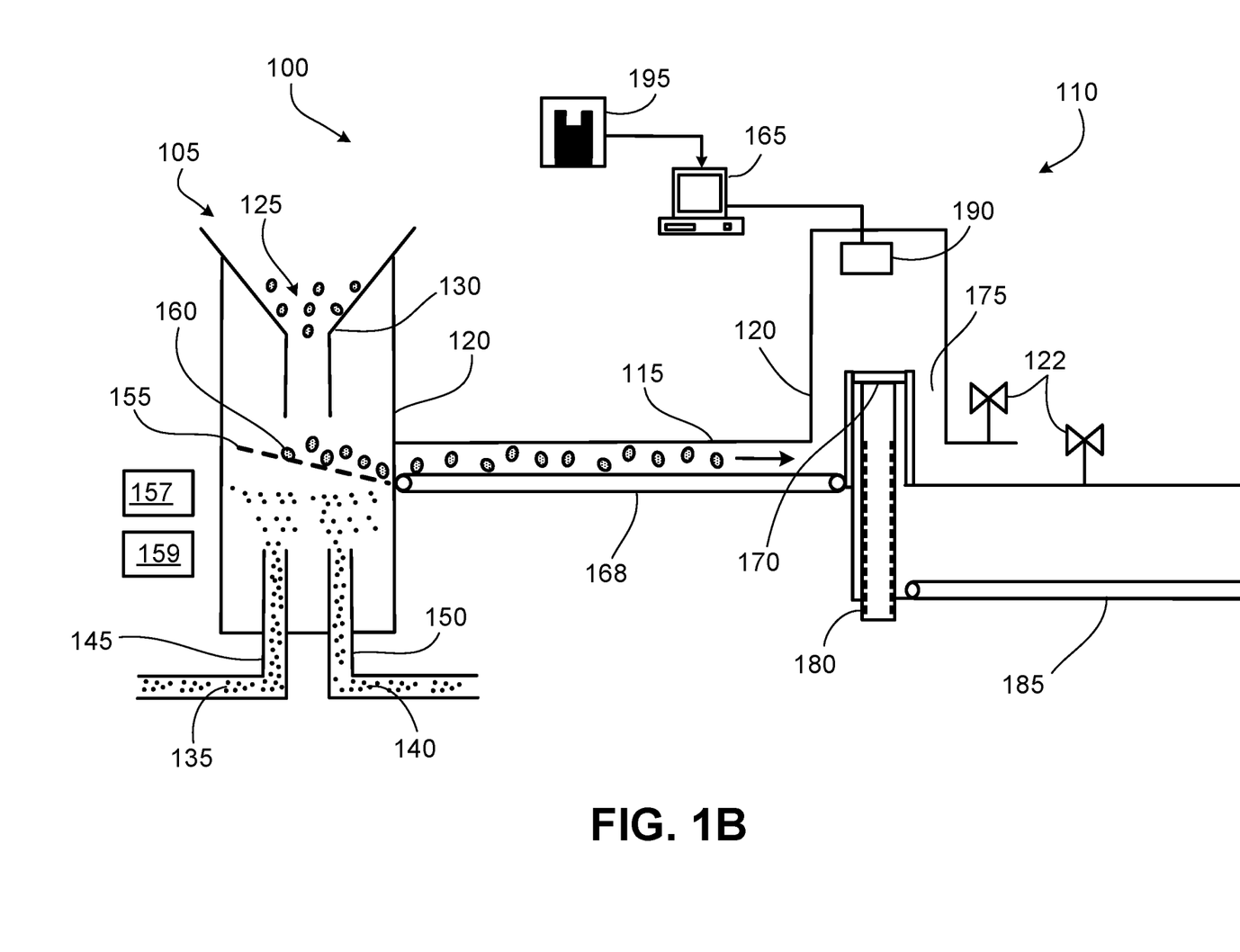

FIG. 1B shows the manufacturing system 100 after the completion of the MLD/ALD coating process in the deposition reactor 105. The MLD/ALD reaction process can be considered to be complete in a number of ways. For example, as the reaction rate for given precursors 135, 150 and substrate particles 125 is well understood, the reaction can be considered complete when the coated particles 160 reach a certain size (coating thickness or particle diameter).

In another example, the reaction is deemed complete when the motorized reaction tray 155 is coated with an amount of coated particles 160 so that the pores of the motorized reaction tray 155 become clogged so as to reduce the efficiency of the coating process. In another example, the reaction is deemed complete when a certain mass of coated particles 160 are determined to be on the motorized reaction tray 155 after a specified time interval. The tray sensor 157 near the motorized reaction tray 155 can be used to determine the end of the coating process; for example, the tray sensor 157 can be a weigh scale or an optical sensor.

When the ALD/MLD process is deemed completed, a tray motor 159 is activated to move the coated particles 160 out of the deposition reactor 105 via a reactor exit. In the example shown, the motorized reaction tray 155 can pivot on one edge as the tray motor 159 raises it from a horizontal position. When the reaction tray 155 is raised, coated particles 160 flow under gravity onto the conveyor belt 168 in the transport tunnel 115. In some instances, the tray motor 159 (or an additional actuator) can shake the raised motorized reaction tray 155 to encourage the coated particles 160 to move into the transport tunnel 115. The coated particles 160 are then transported to the right end of the transport tunnel 115 via the conveyor belt 168. In some instances, rather than a conveyor belt, the fabrication unit 110 is lower than the exit of the deposition reactor 105, and gravity moves the particles towards the fabrication unit 110. In some instances, a door or valve prevents the coated particles 160 from moving into the transport tunnel 115 until desired or a door or valve prevents the coated particles 160 from moving out of the transport tunnel 115 until desired, or a door or both.

Figure 1C:
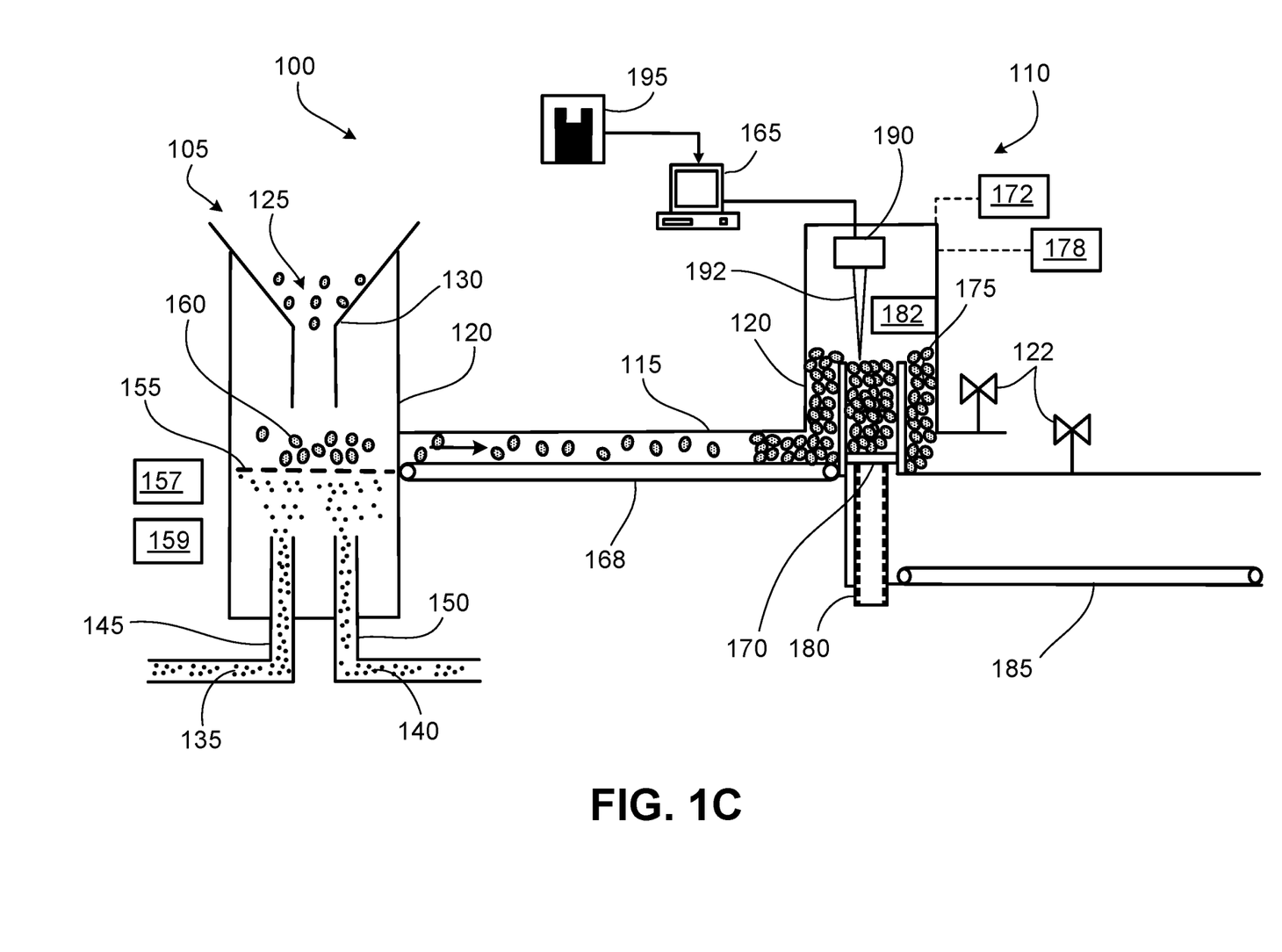

In FIG. 1C, the coated particles 160 have reached the fabrication unit 110 where they accumulate on a powder bed 175. The accumulation continues until a sufficient amount of coated particles 160 have aggregated on the powder bed 175. A sufficient amount may be determined by a certain weight, volume or similar quantitative parameter. The 3D printing head 190 in the fabrication unit 110 directs a beam 192 onto the completed particles 160 that are on the printing platform 170. The beam 192 shapes the completed particles 160 based on the design file 195 and controlled by controller 165. The printing platform 170 is gradually lowered by the printing platform lift 180 during the printing carried out by the 3D printing head to accommodate the increasing height of the part being manufactured.

Figure 3A:
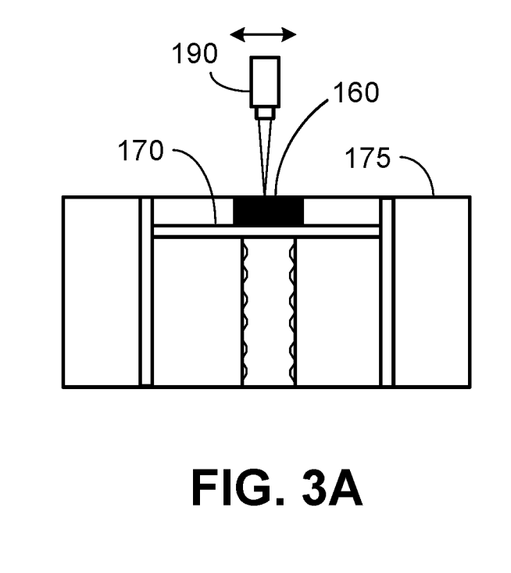
FIGS. 3A-C depict a 3D printing method.
Figure 3B:
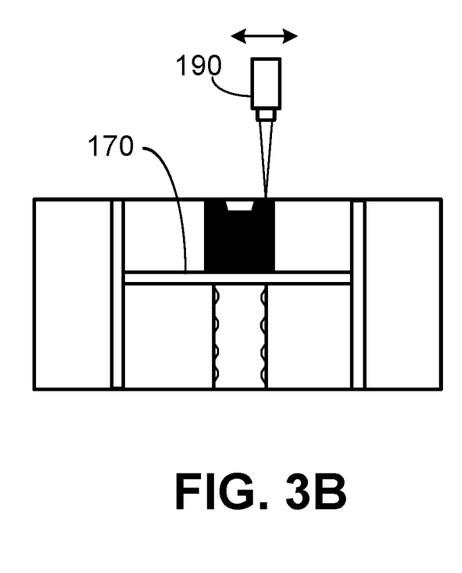
Figure 3C:
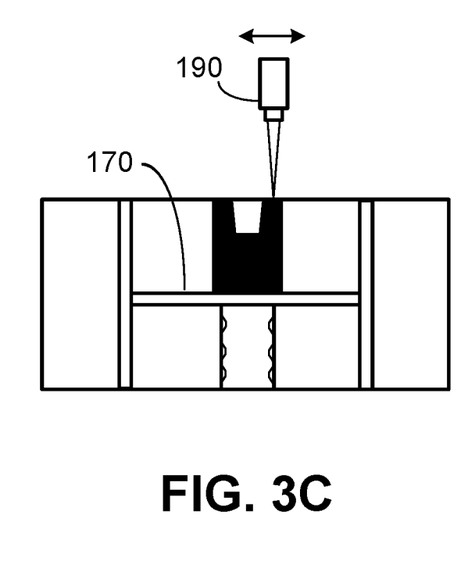

The fabrication process for laser-assisted ALD-coated metal 3D printing (as also shown in FIGS. 3A-C) can include the following steps. Rather than operating under vacuum, the fabrication unit 110 can be filled with an inert gas (such as argon) from a gas source 172 to minimize the oxidation of the coated particles 160. The fabrication unit 110 is heated by a heater 178 to the optimal build temperature, for example, up to the melting point or molten conditions of the coating materials. A thin layer of ALD coated particles 160 is spread over the printing platform 170 by a spreader 182 by methods known in the art (for example, blowing, a boom). The 3D printing head 190 (for example, a laser) scans the cross-section of the component to be built. This energy melts (or fuses) the coated particles 160 together to form a layer of the final piece.

When the scanning (or building) process of the layer is complete, the printing platform 170 moves downwards a distance equivalent to the thickness of the layer. The fused coated particles 160 together form a layer that then becomes the foundation for supporting the next layer to be deposited. The spreader 182 spreads another thin layer of coated particles 160 on the printing platform 170, followed by scanning of the cross section of the next layer with the 3D printing head 190 according to the design file 195. The process is repeated until the whole part is completed.

Figure 1D:
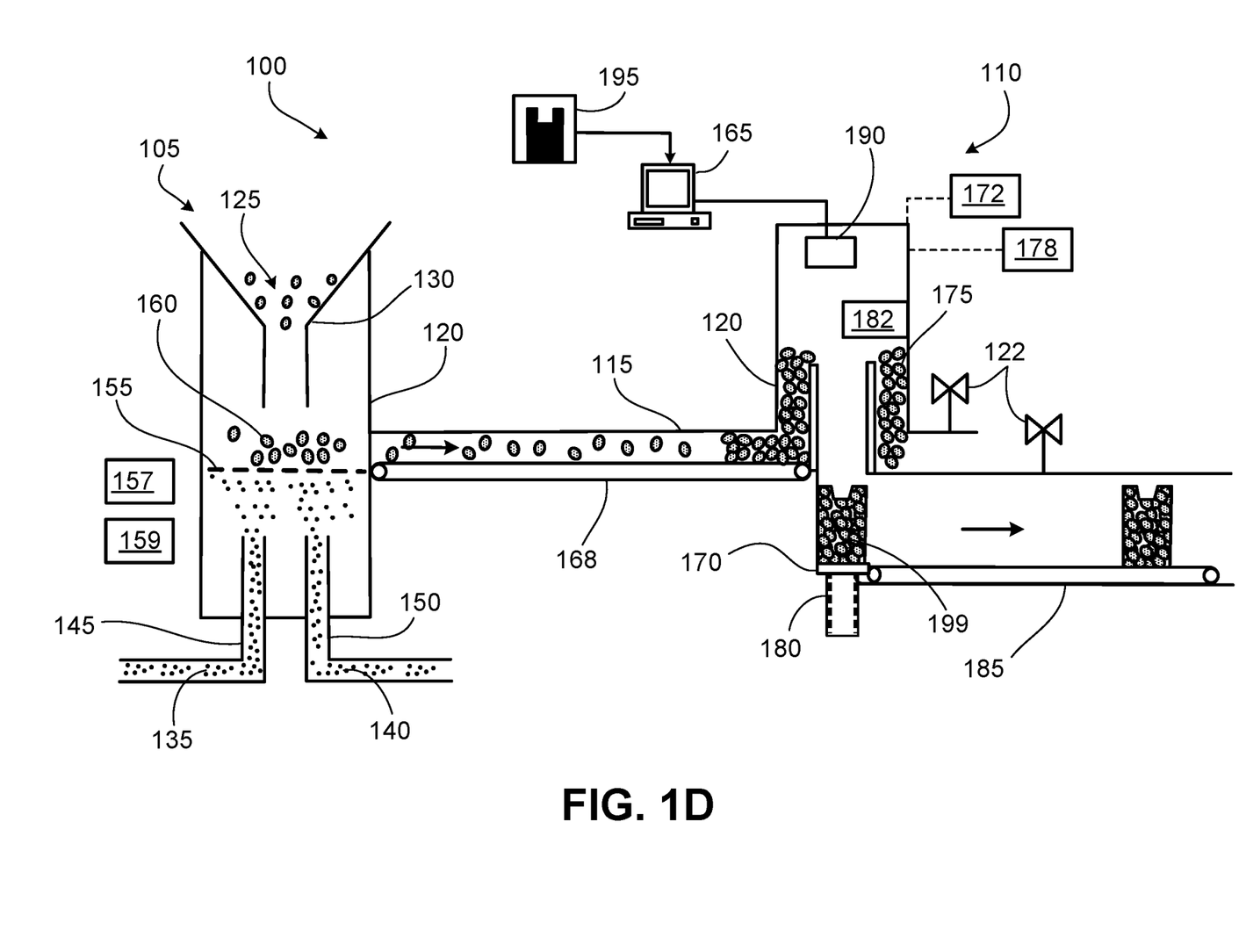

FIG. 1D shows the manufacturing system 100 after completion of the 3D printing process. When the build process is finished, the finished pieces 199 are fully encapsulated in metal powder. The heated fabrication unit 110 is allowed to cool to room temperature, and any excess coated particles 160 are manually removed (for example, blown away). In some instances, the finished product 199 is heat-treated (for example, by the heater 178) while still attached to the printing platform 170 to relieve any residual stresses.

The printing platform lift 180 moves fully downwards and carries the finished product 199 on the printing platform 170 to the bottom level of the fabrication unit 110. The finished product 199 is detached from the printing platform 170 via cutting, machining or wire electrical discharge machining (EDM). The detached finished piece 199 is transferred to the second conveyer belt 185, which transports the finished piece 199 through the various vacuum valves 122 to exit the vacuum system 120 (or the chamber filled with inert gas). For example, the finished piece 199 can be transported to a bin, where it is ready for use, or to a completion chamber for further post-processing.

Typical post-processing techniques include polishing and buffing, nitriding, and additional heat treatment. Polishing and buffing are finishing processes for smoothing the surface of a piece using an abrasive and a work wheel or a leather strop. The strength of polished products is normally higher than their rougher counterpart owing to the removal of stress concentrations present in the rough surface. These take the form of corners and other defects which magnify the local stress beyond the inherent strength of the material.

Nitriding is a heat treating process that diffuses nitrogen into the surface of a metal to create a case-hardened surface. These processes are most commonly used on low-carbon, low-alloy steels. They are also used on medium and high-carbon steels, titanium, aluminum and molybdenum. Heat treating is a group of industrial and metalworking processes used to alter the physical, and sometimes chemical, properties of a material. Heat treatment techniques include annealing, case hardening, precipitation strengthening, tempering, normalizing, and quenching.

In some instances, while the 3D printing process is taking place within the fabrication unit 110, an additional ALD/MLD coating process can simultaneously be occurring within the deposition reactor 105. Thus, multiple finished pieces 199 can be manufactured without pause as represented by the two finished pieces 199 shown in FIG. 1D.

Figure 2:
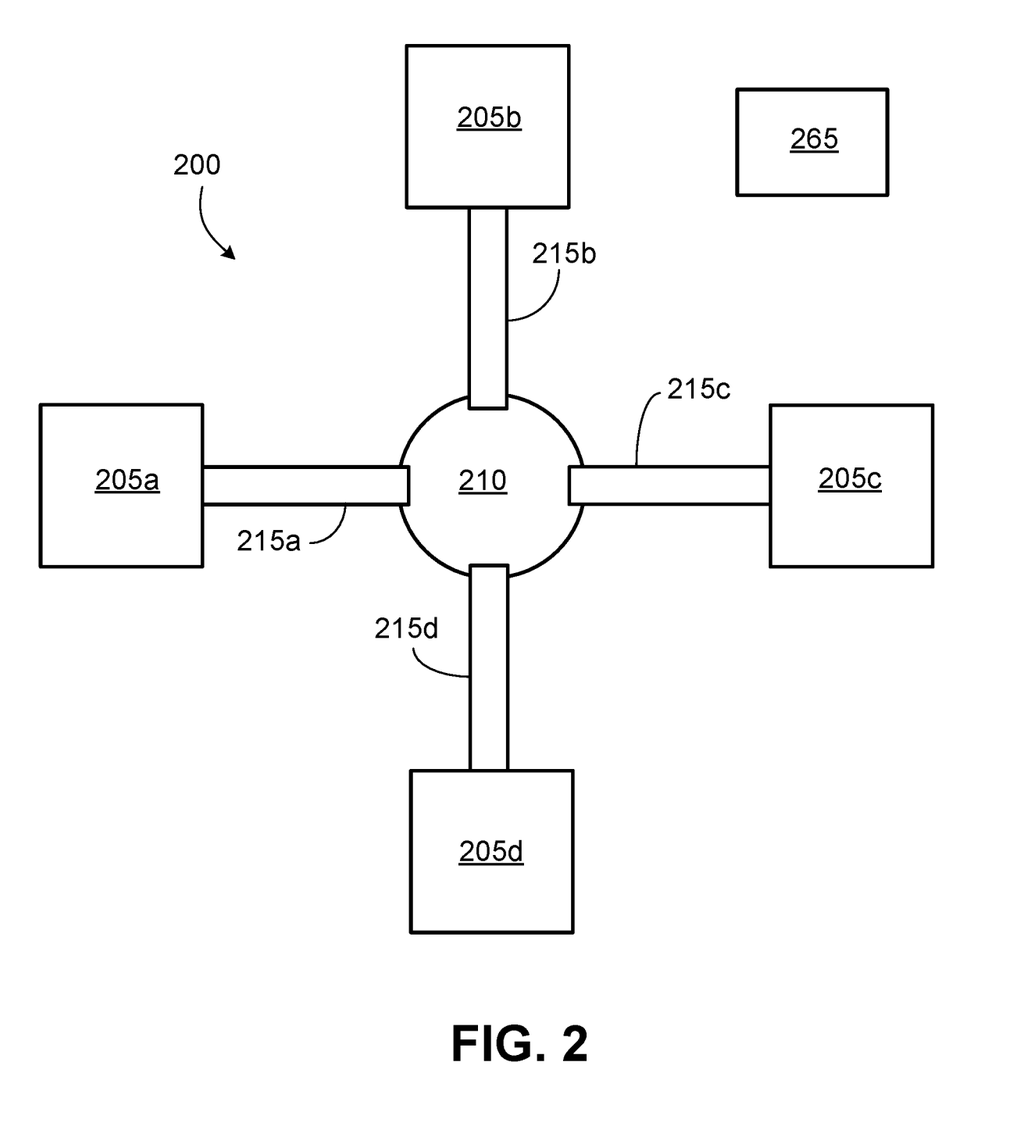
FIG. 2 shows a top view of a multiple MLD with 3D printing manufacturing system.

FIG. 2 shows a top view of a multiple manufacturing system 200 used to further increase the speed of manufacture of finished pieces. The components of the multiple manufacturing system 200 are similar to those of the manufacturing system 100, but in some instances are duplicated. These duplicated components include multiple deposition reactors 205*a*, 205*b*, 205*c*, 205*d* attached to multiple transport tunnels 215*a*, 215*b*, 215*c*, 215*d* (as well as the other components in FIGS. 1A-D, not shown for clarity).

As the rate of MLD/ALD deposition is slower than that of 3D printing, the fabrication of coated particles is the rate-limiting step in tool fabrication. In the multiple manufacturing system 200, the four deposition reactors 205*a*, 205*b*, 205*c*, 205*d* all feed their coated particles to a single fabrication unit 210. The fabrication unit can be controlled by (for example by a controller 265) to accept coated particles from all the deposition reactors 205*a*, 205*b*, 205*c*, 205*d*. The transfer of coated particles can be in sequential, or any other arrangement that combines their outputs of coated particles into the powder bed within the fabrication unit 210. The four deposition reactors 205a, 205b, 205c, 205d can transfer particles to be used in fabricating a single finished piece. Alternatively the controller 265 can accept the output of each deposition reactor 205a, 205b, 205c, 205d to rapidly produce a series of separate finished pieces.

In some embodiments, each of the deposition reactor 205a, 205b, 205c, 205d uses the same substrate particles and precursors. In other instances, one or more of the deposition reactors 205a, 205b, 205c, 205d uses different substrate particles or precursors to create different materials to act as the building material for different tools or both. While four deposition reactors 205 are shown in the figures, fewer or more deposition reactors are possible. For example, a single fabrication unit 210 can be linked to two, three, five or more deposition reactors 205.

The laser-assisted metal 3D printing technique uses power from the laser head to form solid metallic structures in a powder bed via melting and fusion. Based on the 3D design of the object to print (for example, stored in the design file 195), the laser head (for example, 3D printing head 190) scans and selectively fuses (or melts) the metal powder particles, bonding them together and building a part layer-by-layer. The entire area of the finished piece 199 is contained in the design file 195, and the finished piece 199 is built as a monolithic solid.

The materials used in the 3D printing processes are metals that come in a granular form. The metal powders can either be a single metal or metal alloys coated with ALD particles, or a combination of them. Depending on the types of metal powder, the laser reaches a melting temperature and fully melts the particles for a metal powder coated with ALD particles or variable melting points that fuse on a molecular level at elevated temperatures for metal alloys coated with ALD particles. In addition to the metallurgical bonding, under high temperature of the laser, the ALD coatings form glass phases and bond the particles together.

FIGS. 3A-C show details of the 3D printing process. First, a thin layer of ALD/MLD coated particles 160 is spread over the printing platform 170 and the 3D printing head 190 (for example, a high power laser) scans the cross-section of the component to be built. This energy melts (or fuses) the coated particles 160 together to form a layer of the final piece.

When the scanning (or building) process of the layer is complete, the printing platform 170 moves downwards by the thickness of the layer. The fused coated particles 160 together form a layer that then becomes the foundation for supporting the next layer to be deposited. The coater spreads another thin layer of coated particles 160 on the printing platform 170, followed by scanning of the cross section of the next layer according to the design file 195. The process is repeated until the whole part is completed.

The layer height used in metal 3D printing can vary between about 20 to about 50 microns and depends on the properties of the ALD coated metal powder characteristics, such as flowability, particle size distribution, and shape. The build size of a metal 3D printing system varies from 250× 150×150 millimeters (mm), to larger systems for printing up to 500×280×360 mm. The dimensional accuracy that a metal 3D printer can achieve is approximately ±0.1 mm.

The metal powder in such 3D printing systems is highly recyclable: typically less than 5% is wasted. After each print, any unused powder is collected, sieved and then topped up with fresh material to the level required for the next built.

A non-exhaustive list of drilling tools that could be fabricated with the manufacturing system 100 or the multiple manufacturing system 200 includes: downhole motors (stators and rotors), drill bits, tubular goods including drill pipe and tubing for casing completion, subs, reamers, stabilizers, drill collars, differing tools or jars, drilling microchip boxes, drill rig parts or components.

3D Printing Processes

The laser assisted metal 3D printing technique uses power from the laser head to form solid metallic structures in a powder bed via melting and fusion. Based on the 3D design of the object to print (for example, stored in the design file 195), the laser head (for example, 3D printing head 190) scans and selectively fuses (or melts) the metal powder particles, bonding them together and building a part layer-by-layer. The entire area of the finished piece 199 is contained in the design file 195, and the finished piece 199 is built as a monolithic solid.

The materials used in the processes are metals that come in a granular form. The metal powders can either be a single metal or metal alloys coated with ALD particles, or a combination of them. Depending on the types of metal powder, the laser reaches a melting temperature and fully melts the particles for a metal powder coated with ALD particles or variable melting points that fuse on a molecular level at elevated temperatures for metal alloys coated with ALD particles. In addition to the metallurgical bonding, under high temperature of the laser, the ALD coatings form glass phases and bond the particles together.

FIGS. 3A-C show details of the 3D printing process. First, a thin layer of ALD/MLD coated particles 160 is spread over the printing platform 170 (FIG. 3A), taken from the powder bed 175. The 3D printing head 190 (for example, a high power laser) scans back and forth as illustrated by the double-headed arrow to cover the cross-section of the component to be fabricated. The energy from the 3D printing head 190 melts (or fuses) the coated particles 160 together to form a single layer of the drilling tool being fabricated.

When the scanning (or building) process of the first layer is complete, the printing platform 170 moves downwards by the thickness of the layer. The fused coated particles forms a layer that then becomes the foundation for supporting the next layer to be deposited (FIG. 3B). The spreader 182 (not shown in figures) spreads another thin layer of coated particles on the printing platform 170 and over the previously fused coated particles to be the basis of the next layer of the tool being fabricated. The 3D printing head 190 then scans the cross section of the tool as saved in the design file 195 to build the next layer of the fabricated tool. As illustrated, any subsequent layer in the additive manufacturing process can have a different cross section than the previous layer, according to the structure of the tool saved in the design file 195. The lowering and scanning process is repeated (FIG. 3C) until the whole part is completed.

ALD/MLD Processes

Most downhole tool tubulars and sensing devices are made of metal alloys or polymers or both. The ALD or MLD coating substrate materials can be metal particles such as iron (Fe), stainless steel, nickel (Ni), aluminum (Al), tin (Su), copper (Cu), and their alloys such as Inconel®; polymers such as thermoset or thermoplastics powders, and ceramic powders or particles such as $Al_2O_3$, $ZrO_2$, SiC and $Ni_3N_4$.

To enhance the wear resistance of manufactured drilling parts or other components, the hard coating materials can be oxides, carbides, or nitrides. For enhancing tool material strength, the catalyst and hardening coating materials can be metals, nitrides, carbides, or ceramics. For anti-corrosion properties, the coating materials can be oxide barrier materials. Coating materials that can advantageously used with the substrate materials are shown in Table 1, but are not limited to those materials.

TABLE 1

| Oxides | | | | | Nitrides/carbides | | Sulfides | Metals/tellurides |
|---|---|---|---|---|---|---|---|---|
| $Al_2O_3$ | $Fe_2O_3$ | $Li_3PO_4$ | $NiFe_2O_4$ | $V_2O_5$ | AlGaN | MnN | CdS | Co |
| $Al:HfO_2$ | $Fe_3O_4$ | LiPON | NiO | $WO_3$ | AlN | NbN | CoS | Cu |
| Al:ZnO | $FePO_4$ | $LiFePO_4$ | NiO | $Y_2O_3$ | BxGa1-xN | NbTiN | $Cu_2S$ | Fe |
| AlGaN | $Ga_2O_3$ | $Li_2MnO_4$ | PO4 | YSZ | BxIn1-xN | $Si_3N4$ | $Cu_2ZnSnS_4$ | Mn |
| BOx | $HfO_2$ | $Li5TaOz$ | $SiO_2$ | $ZnAl_2O_4$ | CoN | TaN | $In_2S_3$ | Ni |
| $BiFeO_3$ | HfSiON | MgO | $SnO_2$ | ZnO | Hf3N4 | TiN | MnS | Pd |
| $CeO_2$ | $I_{n2}O_3$ | $MnO_2$ | SrO | ZnMgO | InAlN | WN | PbS | Pt |
| $Co_3O_4$ | ITO | $MoO_3$ | $SrTiO_3$ | ZnOS | InGaN | ZrN | $Sb_2S_3$ | Ru |
| $CoFe_2O_4$ | $La_2O_3$ | NaTiO | $Ta_2O_5$ | $ZrO_2$ | InN | SiC | SnS | $Bi_2Te_3$ |
| $Er_2O_3$ | $Li_2O$ | $Nb_2O_5$ | $TiO_2$ | | TiC | ZrC | ZnS | $Sb_2Te_3$ |

The ALD or MLD of nanolaminates and alloys has many applications in downhole MWD and logging device additive manufacturing and nanostructure engineering. MLD using $HfO_2/Ta_2O_5$ (hafna/tantalum pentoxide) nanolaminates can be used as dielectric films for downhole sensing device batteries. The $HfO_2/Ta_2O_5$ nanolaminates can be tuned to improve the charge storage in dielectric films for high temperature environments. Nanolaminates can also be fabricated that display novel physical properties as the layer thickness is less than or equal to the length scale that defines the physical property. For example, hard films can be constructed when the layer thickness is less than the slip plane dislocation length. Thermal barrier coatings can be fabricated when the layer thickness is less than the phonon mean free path in the material. The $Al_2O_3$/tungsten (W) ceramic/metal nanolaminate composite can be used as a thermal barrier coating because of the large frequency difference between phonons in $Al_2O_3$ and W. Other examples are $TiO_2/Al_2O_3$, AlP/GaP, and $Al_2O_3/W_6$ nanolaminates. Tungsten carbides are also possible.

MLD using $Al_2O_3$ on carbon nanotubes (CNTs) and graphene particle surfaces can be used as building materials for the additive manufacturing of high performance downhole drilling tools. $Al_2O_3$ MLD on single-walled and multi-walled CNTs are applied to formation of isolated $Al_2O_3$ nanospheres. The nucleation of the $Al_2O_3$ MLD can be facilitated by the functionalization of the CNTs with nitroaniline or $NO_2$. The $NO_2$ group on the surface of the CNTs provides a chemical site for the adsorption of $Al(CH_3)_3$ and yields a conformal $Al(CH_3)_3$ MLD film on the CNTs after multiple $Al(CH_3)_3$ MLD cycles. Like the CNT surface, the graphene surface is inert. $Al_2O_3$ MLD and $HfO_2$ MLD can apply ozone to create nucleation sites on the basal plane of graphene for $Al_2O_3$ MLD. Chemical treatment using perylene tetracarboxylic acid can also be used to functionalize graphene for $Al_2O_3$ MLD.

ALD or MLD on downhole drilling nanostructures such as nanotubes and nanowires may face similar issues to ALD or MLD on particles. For large quantities of nanotubes or nanowires, the nanostructures will also need to be fluidized or agitated in a rotary reactor to obtain sufficient gas conductance for efficient ALD or MLD reactions. In this disclosure, some of the examples for ALD or MLD on nanotubes and nanowires include $Al_2O_3$ ALD or MLD on multiwalled carbon nanotubes (CNTs) and $Al_2O_3$ MLD on ZnO nanorods. Coaxial multilayer coatings such as $Al_2O_3/W/Al_2O_3$ can be made.

ALD particle methods use self-limiting surface chemistry to achieve growth rates typically on the order of 1 Å/cycle, varying with chemistry and deposition conditions. Base (tool) material particles are fluidized with the assistance of a magnetically-coupled stirring unit. $N_2$ can be used as the inert fluidizing gas and a magnetically-coupled stirring unit is employed to assist in the low-pressure fluidization of the nanoparticle bed. Each powder bed is easily fluidized while stirring at a rate of 20 rotations per minute (rpm). The pressure response becomes stable at a superficial gas velocity of ~7 centimeters per second (cm/s). The pressure drop plateaus associated with the minimum fluidization velocity is ~40 Pascals (Pa) for $SiO_2$ spheres and ~30 Pa for ZnO nanoparticles, for example. Each of these values exceed the weight/area of the powder bed. Precursors such as trimethylaluminum for $Al_2O_3$ and diethylzinc for ZnO provide the dosing pressure required to easily fluidize sizeable nanopowder beds under vacuum conditions.

The MLD of $Al_2O_3$ is shown here as a model MLD system. $Al_2O_3$ MLD is usually performed using trimethylaluminum (TMA) and $H_2O$. The surface chemistry during $Al_2O_3$ MLD can be described as:

$$(A) AlOH^* + Al(CH_3)_3 \rightarrow AlOAl(CH_3)_2^* + CH_4 \quad (1)$$

$$(B) AlCH_3^* + H_2O \rightarrow AlOH^* = CH_4 \quad (2)$$

where the asterisks denote the surface species. The $Al_2O_3$ MLD growth occurs during alternating exposures to TMA and $H_2O$. $Al_2O_3$ MLD is a model system because the surface reactions are efficient and self-limiting. The main driver for the efficient reactions is the formation of a strong Al—O bond.

Another example in this disclosure is $Al_2O_3$ MLD on carbon nanotubes (CNTs) and graphene particle surfaces as building materials for developing additive manufacturing of high performance downhole drilling tools. $Al_2O_3$ MLD on single-walled and multi-walled CNTs are applied to formation of isolated $Al_2O_3$ nanospheres. The nucleation of the $Al_2O_3$ MLD can be facilitated by the functionalization of the CNTs with nitroaniline or $NO_2$. The $NO_2$ group on the surface of the CNTs provides a chemical site for the adsorption of $Al(CH_3)_3$ and yields a conformal $Al_2O_3$ MLD film on the CNTs after multiple $Al_2O_3$ MLD cycles. Like the CNT surface, the graphene surface is inert. $Al_2O_3$ MLD and $HfO_2$ MLD can apply ozone to create nucleation sites on the basal plane of graphene for $Al_2O_3$ MLD. Chemical treatment using perylene tetracarboxylic acid can also be used to functionalize graphene for $Al_2O_3$ MLD.

Since most of downhole tool tubulars and sensing devices are made of metal alloys, the MLD of nanolaminates and alloys has many applications in downhole MWD and logging device additive manufacturing and nanostructure engineering. One example uses MLD $HfO_2/Ta_2O_5$ nanolaminates in a downhole sensing device battery. The $HfO_2/Ta_2O_5$ nanolaminates can be tuned to improve the charge storage in dielectric films for high temperature environments. Nanolaminates can also be fabricated that display novel physical properties because the layer thickness is less than or equal to the length scale that defines the physical property. For example, hard films can be constructed when the layer thickness is less than the slip plane dislocation length. Thermal barrier coatings can be fabricated when the layer thickness is less than the phonon mean free path in the material. A $Al_2O_3$/W ceramic/metal nanolaminate composite can be used as a thermal barrier coating because of the large frequency difference between phonons in $Al_2O_3$ and W. Other examples are $TiO_2/Al_2O_3$ $Al_2O_3$, AlP/GaP, and $Al_2O_3/W_6$ nanolaminates.

The precise control over individual surface reactions during MLD also allows for the fabrication of alloys and graded materials. For example, if the temperature for the MLD reactions is similar for two MLD systems forming an alloy, then the alloy can be grown by alternating back-and-forth between the MLD cycles for the first material and the MLD cycles for the second material. The composition of the alloy can be controlled by the relative number of MLD cycles for each material. The relative number of MLD cycles of each material could also change progressively to fabricate a graded material. An example of an alloy grown using MLD is the $Al_2O_3$/ZnO alloy. The $Al_2O_3$/ZnO alloy can be grown by alternating between the TMA and $H_2O$ reaction cycles for $Al_2O_3$ MLD and the diethylzinc and $H_2O$ reaction cycles for ZnO MLD.

MLD on particles has been demonstrated in a particle bed that is fluidized. During fluidization, the upward force of the pressure drop across the particle bed equals the downward force of gravity on the particle bed. Although particle aggregates form during fluidization, the aggregates are dynamic and the constant exchange of particles between the aggregates prevents the particles from being "glued together" during MLD, as does the agitation of the particles. A bed of fluidized particles will have much higher gas conductance and the moving particles allow the gas phase MLD reactants to encounter all the accessible particle surface area in a shorter time than for a static bed.

ALD or MLD on particles can be also carried out in a rotary reactor that tumbles the particles in a porous metal cylinder to prevent agglomeration. In contrast to the fluidized bed reactor, the rotary reactor can be operated using static exposures because a constant gas flux is not needed to fluidize the particles.

ALD/MLD processes are based on binary reaction sequences where two surface reactions occur and deposit a binary compound film on substrate particles. Because there are only a finite number of surface sites, the reactions can only deposit a finite number of surface species. If each of the two surface reactions is self-limiting, then the two reactions may proceed in a sequential fashion to deposit a thin film with atomic level (or molecular level) control. The self-limiting nature of the surface reactions produces a nonstatistical deposition since the randomness of the precursor flux is removed as an important factor. As a result, ALD films remain smooth and conformal to the original tool substrate because the reactions are driven to completion during every reaction cycle. Because no surface sites are left behind during film growth, the films tend to be continuous and pinhole-free.

An application of 3D printing or additive MLD manufacturing for enhancing the wear resistance of distributed sensing devices for downhole applications is also possible. In the proposed method, MLD-coated micro-sized high density polyethylene polymer particles with high wear resistance ultrathin alumina ceramic films are filled in a mold to form the lower protective hemisphere. After placing the sensor module in the center of the mold, an upper mold is assembled and the rest of the MLD coated particles are filled to form the upper protective hemisphere. The finished device is fully protected by the MLD coated particles which enhances the wear resistance of the sensor for downhole application. Other high wear resistance ceramic thin film materials include but not limited to $SiO_2$, $ZrO_2$, SiC, and $Si_3N_4$ in this disclosure.

Another application of additive MLD manufacturing for enhancing the wear resistance of downhole tools uses carbon fiber and composites as building materials for downhole tubulars, centralizers and other downhole tools. In the proposed method, additive MLD manufacturing process is integrated into the manufacturing of carbon fiber and composite downhole products. MLD coatings are applied on the fiber and composite material particles during the manufacturing. In the finished product, MLD coating layers functions in each of the laminated carbon fiber layers to provide a superior wear resistance property.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system for manufacture of a tool, the system comprising:
    a deposition reactor configured for molecular layer deposition or atomic layer deposition of powder to manufacture coated particles, the deposition reactor comprising:
        an inlet for substrate particles;
        an inlet for precursor gases; and
        a reaction tray configured to collect coated particles, the reaction tray comprising pores configured to permit passage of gas therethrough but not passage of substrate particles therethrough,
    a fabrication unit configured for 3D printing of the tool; and
    a controller that controls the deposition reactor and the fabrication unit,
    wherein the fabrication unit and the deposition reactor are integrated for automated fabrication of the tool using the coated particles from the deposition reactor as building material for the 3D printing, and
    wherein the deposition reactor is configured so that the precursor gases initially contact a first side of the reaction tray and so that the substrate particles are disposed on a second side of the reaction tray opposite the first side of the reaction tray.

2. The system of claim 1, wherein the reaction tray comprises metal.

3. The system of claim 1, wherein the reaction tray is movable to transfer the coated particles out of the deposition reactor.

4. The system of claim 1, further comprising a transport tunnel that joins the deposition reactor and the fabrication unit.

5. The system of claim 4, wherein the transport tunnel comprises a conveyor belt configured to transport the coated particles from the deposition reactor to the fabrication unit.

6. The system of claim 1, wherein the fabrication unit comprises a printing platform, a printing platform lift, and a 3D printing head.

7. The system of claim 6, wherein the 3D printing head is a laser head.

8. The system of claim 6, wherein the 3D printing head is an electron beam emitter.

9. The system of claim 1, further comprising a vacuum system configured to control gases within the system.

10. The system of claim 1, further comprising at least one additional deposition reactor attached to the fabrication unit.

11. The system of claim 1, wherein the powder is a metal powder.

12. The system of claim 1, wherein the powder is a ceramic, a polymer, or a composite thereof.

13. The system of claim 1, wherein the tool is a drilling tool.

14. The system of claim 1, wherein the inlet for precursor gases is configured to purge excess precursor gas.

15. The system of claim 2, wherein the reaction tray comprises metal that does not react with the substrate particles or the precursor gases.

16. The system of claim 1, wherein the fabrication unit is filled with an inert gas.

* * * * *